US 9,218,084 B2

(12) United States Patent
Wang

(10) Patent No.: US 9,218,084 B2
(45) Date of Patent: Dec. 22, 2015

(54) TOUCH-SENSING DEVICE AND TOUCH-SENSING DISPLAY THEREWITH

(71) Applicant: WINTEK CORPORATION, Taichung (TW)

(72) Inventor: Yueh-Fang Wang, Taichung (TW)

(73) Assignee: WINTEK CORPORATION, Taichung (TW)

( * ) Notice: Subject to any disclaimer, the term of this patent is extended or adjusted under 35 U.S.C. 154(b) by 230 days.

(21) Appl. No.: 14/072,813

(22) Filed: Nov. 6, 2013

(65) Prior Publication Data

US 2014/0125884 A1 May 8, 2014

(30) Foreign Application Priority Data

Nov. 6, 2012 (TW) .............................. 101141136 A

(51) Int. Cl.
*G06F 3/041* (2006.01)
*H05K 3/36* (2006.01)
*H01R 12/65* (2011.01)
*H05K 1/11* (2006.01)
*H05K 3/32* (2006.01)

(52) U.S. Cl.
CPC .............. *G06F 3/0412* (2013.01); *H05K 3/361* (2013.01); *H01R 12/65* (2013.01); *H05K 1/118* (2013.01); *H05K 3/323* (2013.01); *H05K 2201/09445* (2013.01)

(58) Field of Classification Search
None
See application file for complete search history.

(56) References Cited

U.S. PATENT DOCUMENTS

| 6,519,021 | B1 * | 2/2003 | Aruga ........................... 349/152 |
| 2011/0164371 | A1 * | 7/2011 | McClure et al. .......... 361/679.26 |
| 2012/0326990 | A1 * | 12/2012 | Wurzel et al. ................. 345/173 |

* cited by examiner

Primary Examiner — Nicholas Lee
(74) Attorney, Agent, or Firm — Ming Chow; Sinorica, LLC

(57) ABSTRACT

A touch-sensing device includes a substrate, a touch-sensing structure, a signal transmitting layer, a first connecting pin assembly and a second connecting pin assembly. The touch-sensing structure is disposed on the substrate. The signal transmitting layer is disposed on the substrate and electrically connected to the touch-sensing structure. The first connecting pin assembly is disposed on the substrate in a position different from the touch-sensing structure. The first connecting pin assembly has a plurality first connecting pins electrically connected to the signal transmitting layer. The second connecting pin assembly is disposed on the substrate in a position different from the touch-sensing structure. The second connecting pin assembly has a plurality second connecting pins electrically connected to the signal transmitting layer. The first axis of the second connecting pin assembly and the second axis of the first connecting pin assembly are not arranged in the same axis.

10 Claims, 7 Drawing Sheets

TOUCH-SENSING DEVICE AND TOUCH-SENSING DISPLAY THEREWITH

BACKGROUND OF THE INVENTION

1. Field of the Invention

The present invention relates to a touch-sensing device and a touch-sensing display therewith, and more particularly, to a touch-sensing device capable of reducing space for connecting a flexible printed circuit board and a touch-sensing display therewith.

2. Description of the Prior Art

Recently, a portable electronic device has a trend towards light, thin, short and small design, which constrains space for connecting the end of the flexible printed circuit board to the touch-sensing device. Conventionally, a logo, holes for an optical component, an audio component and so on are often disposed on the portable electronic device and located near a place where the end of the flexible printed circuit board is connected to the touch-sensing device. The aforesaid structures further constrain the space for connecting the end of the flexible printed circuit board to the touch-sensing device. Thus, how to design a touch-sensing device capable of reducing the space for connecting the flexible printed circuit board and a touch-sensing display therewith becomes an issue in the field.

SUMMARY OF THE INVENTION

The present invention provides a touch-sensing device capable of reducing space for connecting a flexible printed circuit board and a touch-sensing display therewith for solving above drawbacks.

According to an embodiment of the present invention, a touch-sensing device includes a substrate, a touch-sensing structure, a signal transmitting layer, a first connecting pin assembly and a second connecting pin assembly. The touch-sensing structure is disposed on the substrate. The signal transmitting layer is disposed on the substrate and electrically connected to the touch-sensing structure. The first connecting pin assembly is disposed on the substrate and located in a position different from the touch-sensing structure, and the first connecting pin assembly has a plurality first connecting pins arranged along a first axis, and the first connecting pins are electrically connected to a portion of the signal transmitting layer. The second connecting pin assembly is disposed on the substrate and located in a position different from the touch-sensing structure. The second connecting pin assembly has a plurality second connecting pins arranged along a second axis, and the second connecting pins are electrically connected to another portion of the signal transmitting layer, and the second connecting pin assembly and the first connecting pin assembly are not arranged in the same axis.

According to another embodiment of the present invention, a touch-sensing display includes a touch-sensing device and a flexible printed circuit board. The touch-sensing device includes a substrate, a touch-sensing structure, a signal transmitting layer, a first connecting pin assembly and a second connecting pin assembly. The touch-sensing structure is disposed on the substrate. The signal transmitting layer is disposed on the substrate and electrically connected to the touch-sensing structure. The first connecting pin assembly is disposed on the substrate and located in a position different from the touch-sensing structure, and the first connecting pin assembly has a plurality first connecting pins arranged along a first axis, and the first connecting pins are electrically connected to a portion of the signal transmitting layer. The second connecting pin assembly is disposed on the substrate and located in a position different from the touch-sensing structure. The second connecting pin assembly has a plurality second connecting pins arranged along a second axis, and the second connecting pins are electrically connected to another portion of the signal transmitting layer, and the second axis of the second connecting pin assembly and the first axis of the first connecting pin assembly are not arranged in the same axis. The flexible printed circuit board has a first contact assembly and a second contact assembly respectively corresponding to the first connecting pin assembly and the second connecting pin assembly, wherein the first connecting pin assembly is electrically connected to the first contact assembly, and the second connecting pin assembly is electrically connected to the second contact assembly.

According to another embodiment of the present invention, a touch-sensing display includes a touch-sensing device, a flexible printed circuit board and a display device. The touch-sensing device includes a substrate, a touch-sensing structure, a signal transmitting layer, a first connecting pin assembly and a second connecting pin assembly. The touch-sensing structure is disposed on the substrate. The signal transmitting layer is disposed on the substrate and electrically connected to the touch-sensing structure. The first connecting pin assembly is disposed on the substrate and located in a position different from the touch-sensing structure, and the first connecting pin assembly has a plurality first connecting pins arranged along a first axis, and the first connecting pins are electrically connected to a portion of the signal transmitting layer. The second connecting pin assembly is disposed on the substrate and located in a position different from the touch-sensing structure. The second connecting pin assembly has a plurality second connecting pins arranged along a second axis, and the second connecting pins are electrically connected to another portion of the signal transmitting layer, and the second axis of the second connecting pin assembly and the first axis of the first connecting pin assembly are not arranged in the same axis. The flexible printed circuit board has a first contact assembly and a second contact assembly respectively corresponding to the first connecting pin assembly and the second connecting pin assembly, wherein the first connecting pin assembly is electrically connected to the first contact assembly, and the second connecting pin assembly is electrically connected to the second contact assembly. The display device is disposed parallel to the touch-sensing device.

In summary, the present invention utilizes mechanism of the touch-sensing device that the first axis of the first connecting pin assembly and the second axis of the second connecting pin assembly are not arranged in the same axis for reducing the space occupied by the first connecting pin assembly and the second connecting pin assembly in an arrangement direction. In such a manner, the touch-sensing device is capable of providing a larger mechanical space near a place where an end of the flexible printed circuit board is connected to the touch-sensing device, so as to dispose a logo, holes for an optical component, an audio component and so on.

These and other objectives of the present invention will no doubt become obvious to those of ordinary skill in the art after reading the following detailed description of the preferred embodiment that is illustrated in the various figures and drawings.

DETAILED DESCRIPTION

In the following detailed description of the embodiments, reference is made to the accompanying drawings which form a part hereof, and in which is shown by way of illustration specific embodiments in which the invention may be practiced. In this regard, directional terminology, such as "top," "bottom," etc., is used with reference to the orientation of the Figure(s) being described. The components of the present invention can be positioned in a number of different orientations. As such, the directional terminology is used for purposes of illustration and is in no way limiting. On the other hand, the drawings are only schematic and the sizes of components may be exaggerated for clarity. It is to be understood that other embodiments may be utilized and structural changes may be made without departing from the scope of the present invention. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items. Unless limited otherwise, the terms "connected," and "installed" and variations thereof herein are used broadly and encompass direct and indirect connections and installations. Accordingly, the drawings and descriptions will be regarded as illustrative in nature and not as restrictive.

Figure 1:
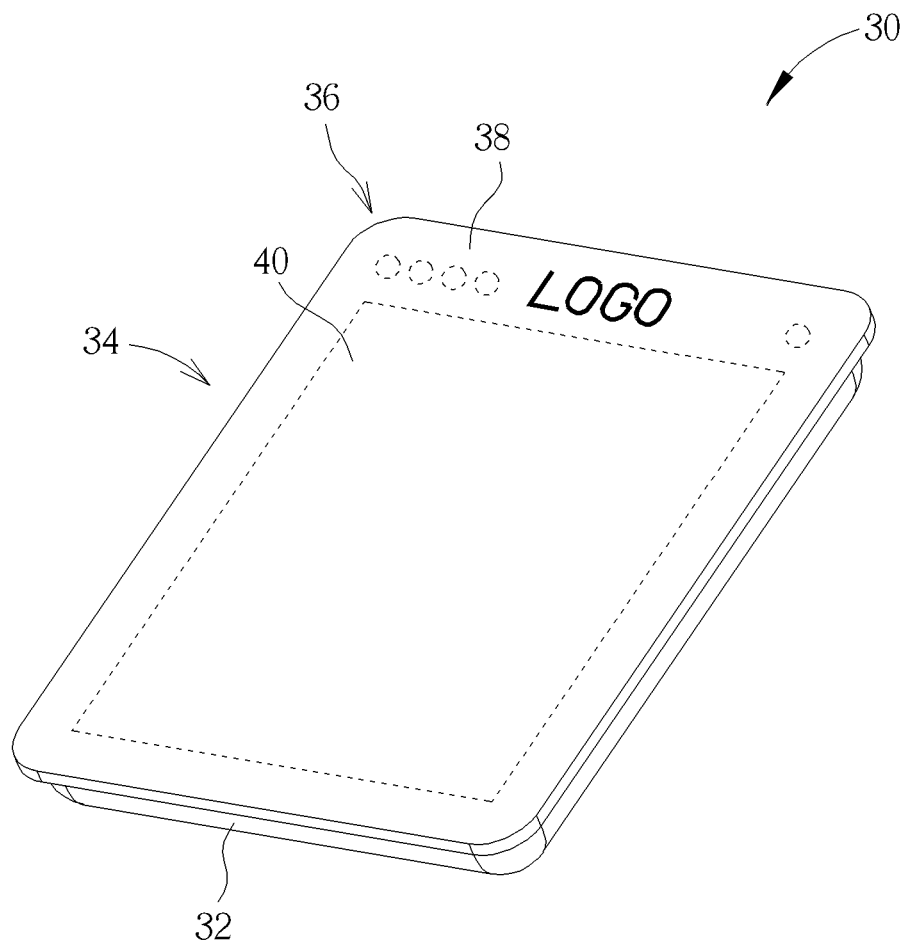
FIG. 1 is a schematic diagram of a touch-sensing display according to a first embodiment of the present invention.
Figure 2:
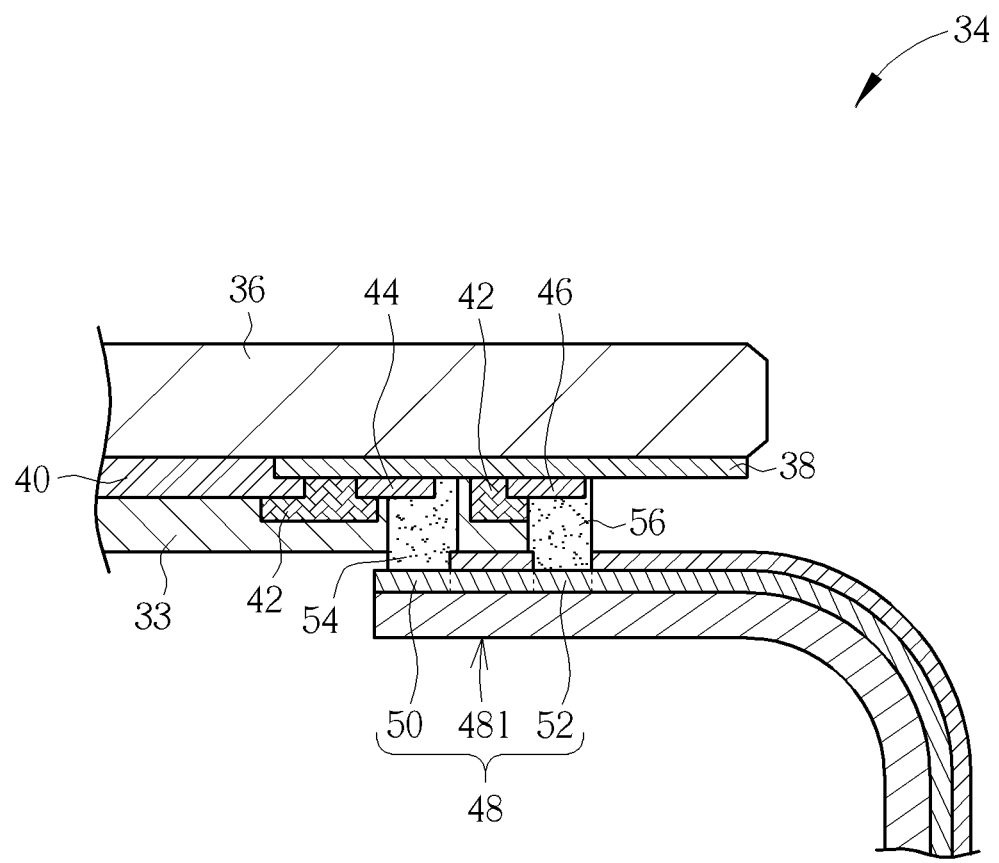
FIG. 2 is a sectional diagram of a touch-sensing device and a flexible printed circuit board according to the first embodiment of the present invention.

Referring to FIG. 1 and FIG. 2, in this embodiment, a touch-sensing display 30 is, but not limited to, a touch-sensing device of a mobile device, such as a mobile phone and so on. For example, the touch-sensing display 30 can be a touch-sensing device of a tablet computer as well. As for which one of the above-mentioned designs is adopted, it depends on practical demands. As shown in FIG. 1 and FIG. 2, the touch-sensing display 30 includes a display device 32 and a touch-sensing device 34, and a transparent optical adhesive 33 is disposed between the touch-sensing device 34 and the display device 32 for combining the touch-sensing device 34 and the display device 32.

As shown in FIG. 1 and FIG. 2, the touch-sensing device 34 includes a substrate 36 and a decorating layer 38. In this embodiment, the substrate 36 is a covering plate, and the decorating layer 38 is disposed on at least one periphery of the covering plate (i.e. the decorating layer 38). The touch-sensing device 34 further includes a touch-sensing structure 40 and a signal transmitting layer 42. The touch-sensing structure 40 and the signal transmitting layer 42 are disposed on the substrate 36, and the signal transmitting layer 42 is located on the decorating layer 38 and used for being electrically connected to the touch-sensing structure 40. The touch-sensing device 34 further includes a first connecting pin assembly 44 and a second connecting pin assembly 46. The first connecting pin assembly 44 and the second connecting pin assembly 46 are disposed on the substrate 36 and located in positions different from the touch-sensing structure 40. The first connecting pin assembly 44 has a plurality first connecting pins arranged along a first axis, and the first connecting pins are electrically connected to a portion of the signal transmitting layer 42. The second connecting pin assembly 46 has a plurality second connecting pins arranged along a second axis, and the second connecting pins are electrically connected to another portion of the signal transmitting layer 42.

Figure 3:
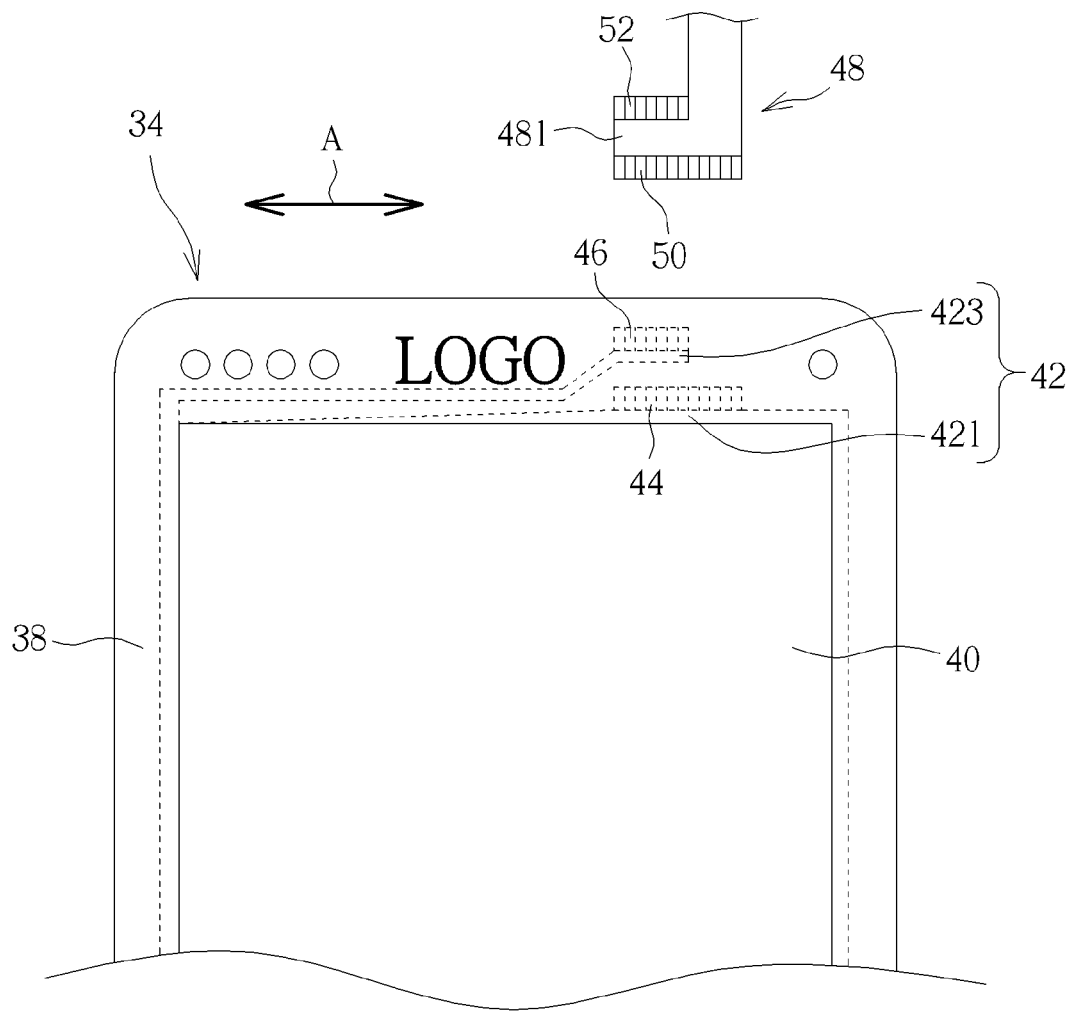
FIG. 3 is an assembly diagram of the touch-sensing device and the flexible printed circuit board according to the first embodiment of the present invention.

Referring to FIG. 3, the first axis of the first connecting pin assembly 44 and the second axis of the second connecting pin assembly 46 are not arranged in the same axis. In this embodiment, the first axis of the first connecting pin assembly 44 of the touch-sensing device 34 and the second axis of the second connecting pin assembly 46 are parallel. Furthermore, the first connecting pin assembly 44 and the second connecting pin assembly 46 are oriented parallel to an arrangement direction A, respectively, so as to reduce space occupied by the first connecting pin assembly 44 and the second connecting pin assembly 46 in the arrangement direction A.

Furthermore, the signal transmitting layer 42 includes a plurality of first transmission channels 421 and a plurality of second transmission channels 423. In this embodiment, the plurality of first transmission channels 421 is electrically connected to the first connecting pin assembly 44, and the plurality of second transmission channels 423 is electrically connected to the second connecting pin assembly 46. It should be noticed that the first transmission channels 421 is not limited to be electrically connected to the first connecting pin assembly 44 and the second transmission channels 423 are not limited to be electrically connected to the second connecting pin assembly 46 in other embodiments, and it depends on practical demands.

In addition, the touch-sensing display 30 of the present invention further includes a flexible printed circuit board 48, which has a first contact assembly 50 and a second contact assembly 52. The first contact assembly 50 and the second contact assembly 52 correspond to the first connecting pin assembly 44 and the second connecting pin assembly 46, respectively. The first connecting pin assembly 44 utilizes a first conducting layer 54 to connect with the first contact assembly 50 on an end portion 481 of the flexible printed circuit board 48, and the second connecting pin assembly 46 utilizes a second conducting layer 56 to connect with the second contact assembly 52 on the end portion 481 of the flexible printed circuit board 48. In this embodiment, the first conducting layer 54 and the second conducting layer 56 are anisotropic conductive films.

In this embodiment, a symbol and a text are disposed on the decorating layer 38, wherein the symbol can be a icon pattern, holes for various functional components, a home key and so on, and the text can be a logo and so on. Depending on practical demands, the touch-sensing structure 40 can be touch control structures with a single-sided dual layer, a single-sided single layer, an electrode on two sides of the substrate and so on. The substrate 36 can be a glass plate, a thin glass film, a plastic plate, a plastic film and so on.

Figure 4:
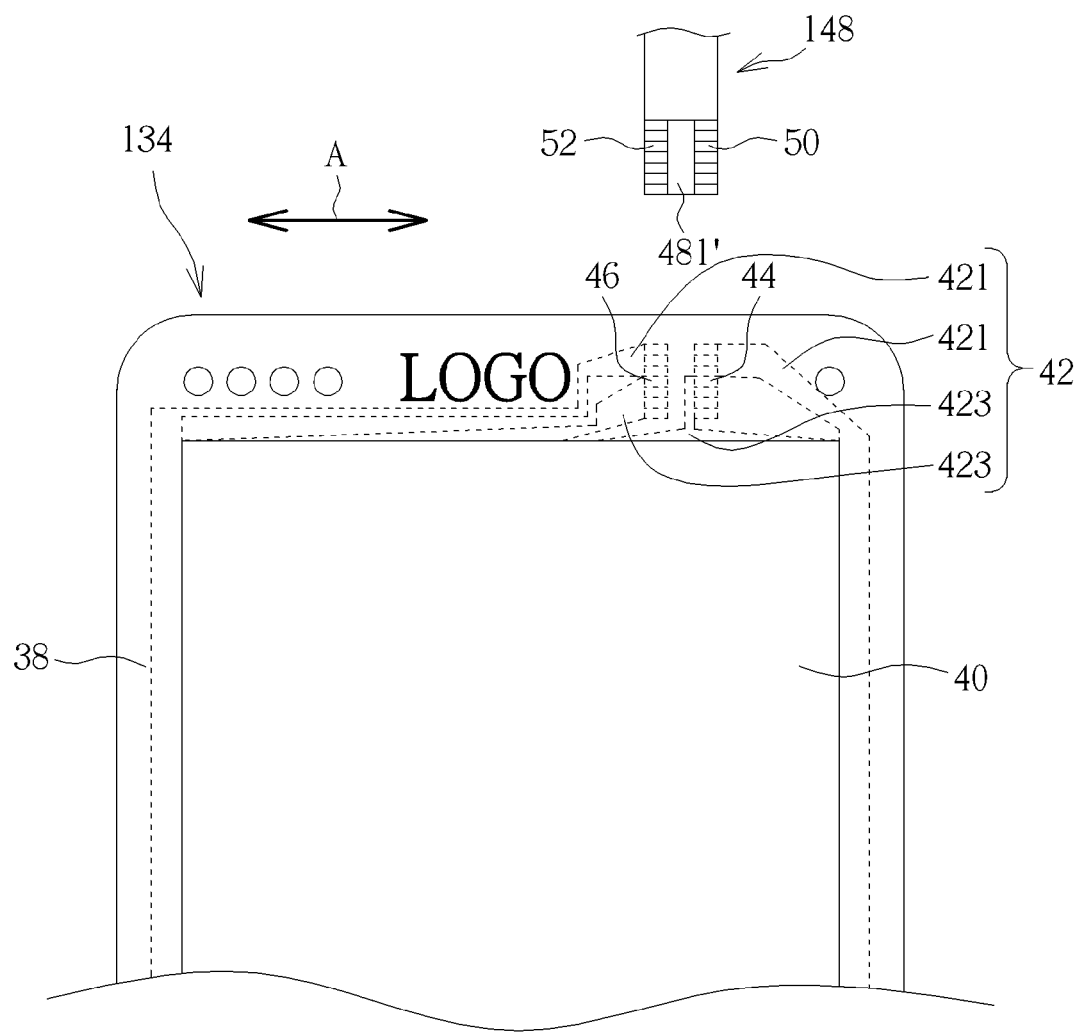
FIG. 4 is an assembly diagram of a touch-sensing device and a flexible printed circuit board according to a second embodiment of the present invention.

Referring to FIG. 4, the main difference between a touch-sensing device 134 in this embodiment and the aforesaid touch-sensing device 34 is that the first connecting pin assembly 44 of the touch-sensing device 134 and the second connecting pin assembly 46 of the touch-sensing device 134 are perpendicular to the arrangement direction A, and the first contact assembly 50 and the second contact assembly 52 on an end portion 481' of the flexible printed circuit board 148 are oriented perpendicular to the arrangement direction A, correspondingly. In this embodiment, the first transmission channels 421 is electrically connected to the first connecting pin assembly 44 and the second connecting pin assembly 46, and the second transmission channels 423 is electrically connected to the first connecting pin assembly 44 and the second connecting pin assembly 46 as well. Accordingly, it enables to increase capability of layout of the first transmission channels 421 and the second transmission channels 423, so as to enhance flexibility of the touch-sensing device 134 in use.

Figure 5:
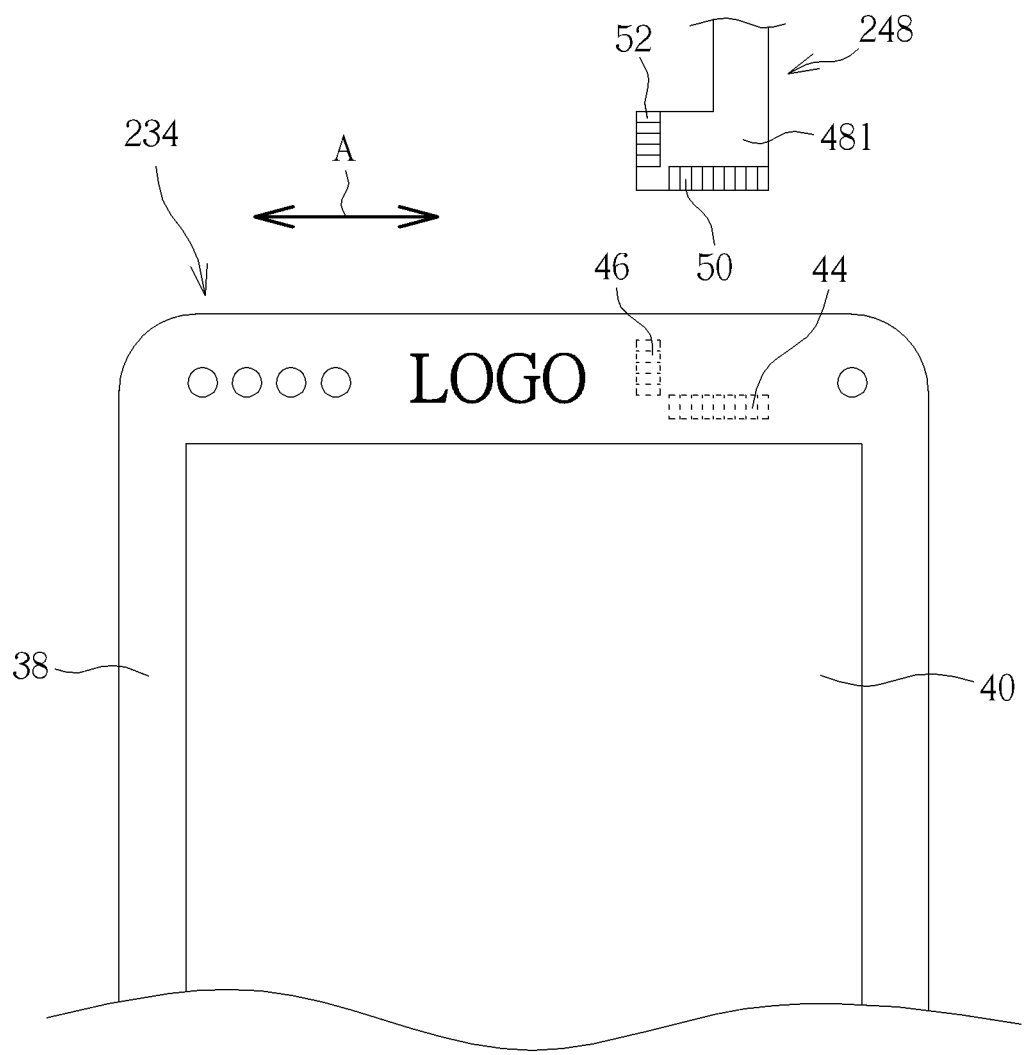
FIG. 5 is an assembly diagram of a touch-sensing device and a flexible printed circuit board according to a third embodiment of the present invention.

Referring to FIG. 5, the main difference between a touch-sensing device 234 and the aforesaid touch-sensing device 34 is that the first connecting pin assembly 44 of the touch-sensing device 234 is oriented parallel to the arrangement direction A, and the first connecting pin assembly 44 of the touch-sensing device 234 is oriented perpendicular to the second connecting pin assembly 46 of the touch-sensing device 234. In other words, the first connecting pin assembly 44 and the second connecting pin assembly 46 of the touch-sensing device 234 can be arranged in a L shape, so that an end of the first connecting pin assembly 44 of the touch-sensing device 234 is adjacent to an end of the second connecting pin assembly 46 of the touch-sensing device 234. In this embodiment, the end portion 481 of a flexible printed circuit board 248 is shaped in substantially reverse L. Furthermore, the first contact assembly 50 and the second contact assembly 52 of the flexible printed circuit board 248 respectively correspond to the first connecting pin assembly 44 and the second connecting pin assembly 46 of the touch-sensing device 234, i.e. an end of the first connecting pin assembly 44 of the touch-sensing device 234 is adjacent to an end of the second connecting pin assembly 46 of the touch-sensing device 234.

Figure 6:
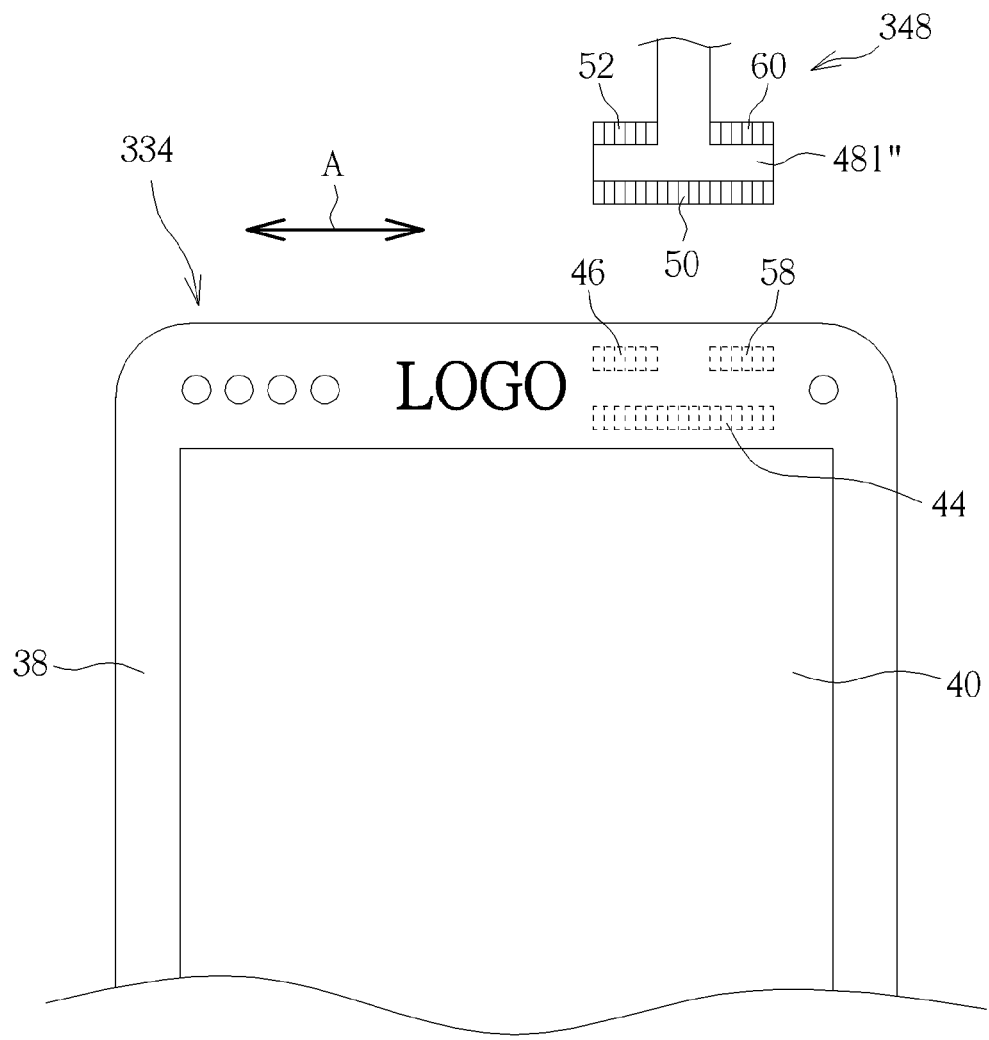
FIG. 6 is an assembly diagram of a touch-sensing device and a flexible printed circuit board according to a fourth embodiment of the present invention.

Referring to FIG. 6, the main difference between a touch-sensing device 334 and the aforesaid touch-sensing device 34 is that the touch-sensing device 334 further includes a third connecting pin assembly 58 electrically connected to the touch-sensing structure 40. The third connecting pin assembly 58 and the second connecting pin assembly 46 are disposed on the same layer, i.e. the third connecting pin assembly 58 and the second connecting pin assembly 46 are the same in horizon. The second connecting pin assembly 46 and the third connecting pin assembly 58 are respectively oriented parallel to the first connecting pin assembly 44. In other words, the third connecting pin assembly 58 is spaced from the second connecting pin assembly 46, and the first connecting pin assembly 44, the second connecting pin assembly 46 and the third connecting pin assembly 58 are oriented parallel to the arrangement direction A.

In this embodiment, an end portion 481' of a flexible printed circuit board 348 is shaped in reverse T. The flexible printed circuit board 348 further includes a third contact assembly 60, and second contact assembly 52 and the third contact assembly 60 of the flexible printed circuit board 348 are disposed on the flexible printed circuit board 348 in the same horizontal position. The first contact assembly 50 is parallel to the second contact assembly 52 and the third contact assembly 60. Accordingly, the first contact assembly 50, the second contact assembly 52 and the third contact assembly 60 of the flexible printed circuit board 348 can utilize the conductive layers to be electrically connected to the first connecting pin assembly 44, the second connecting pin assembly 46 and the third connecting pin assembly 58 of the touch-sensing device 334.

Figure 7:
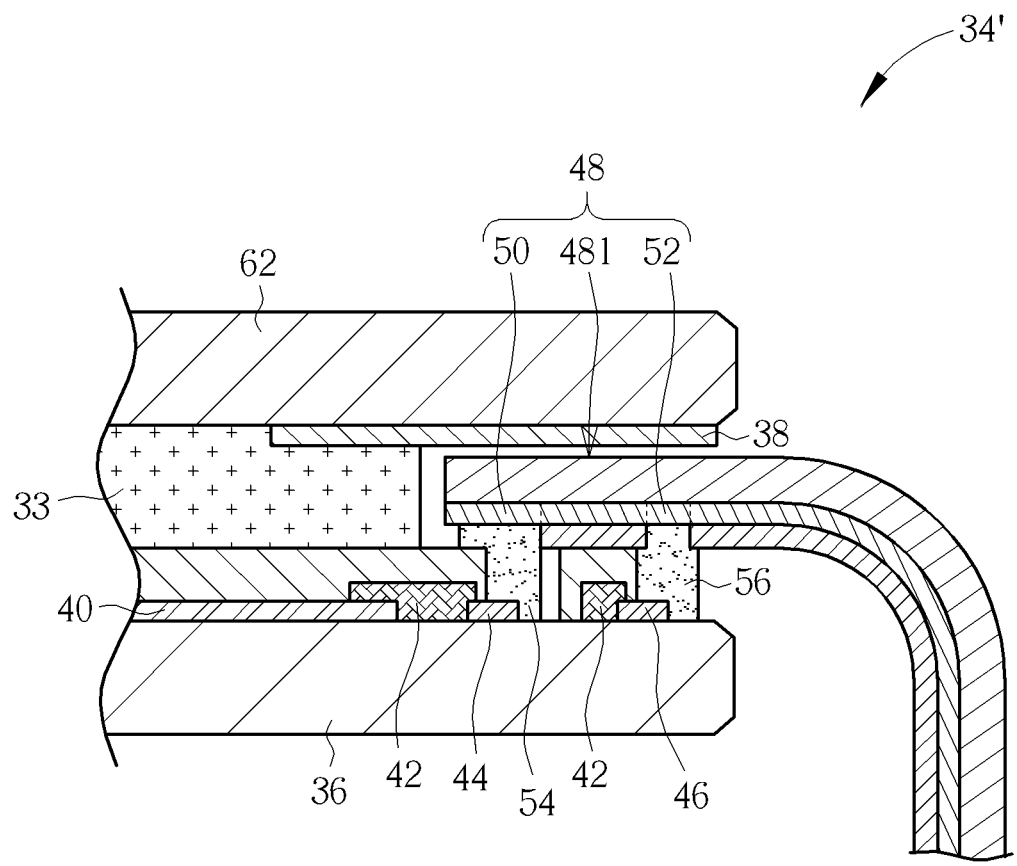
FIG. 7 is a sectional diagram of a touch-sensing device and a flexible printed circuit board according to another embodiment of the present invention.

In addition, the touch-sensing device of the present invention is not limited to those mentioned in the aforesaid embodiments. As shown in FIG. 7, the touch-sensing structure 40, the signal transmitting layer 42, the first connecting pin assembly 44 and the second connecting pin assembly 46 are disposed on the substrate 36 of a touch-sensing device 34' in this embodiment. In addition, the touch-sensing device 34' further includes a covering plate 62, and the decorating layer 38 is disposed on at least one periphery of the covering plate 62. In addition, the transparent optical adhesive 33 is used for combining the substrate 36 and the covering plate 62, and the first connecting pin assembly 44 and the second connecting pin assembly 46 are exposed, so that the first connecting pin assembly and the second connecting pin assembly 46 are electrically connected to the first contact assembly 50 and the second contact assembly 52 of the flexible printed circuit board 48.

Compared to the prior art, the present invention utilizes mechanism of the touch-sensing device that the first axis of the first connecting pin assembly and the second axis of the second connecting pin assembly are not arranged in the same axis for reducing the space occupied by the first connecting pin assembly and the second connecting pin assembly in an arrangement direction. In such a manner, the touch-sensing device is capable of providing a larger mechanical space near the place where the end of the flexible printed circuit board is connected to the touch-sensing device, so as to dispose a logo, holes for an optical component, an audio component and so on.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A touch-sensing device, comprising:
   a substrate;
   a touch-sensing structure disposed on the substrate;
   a signal transmitting layer disposed on the substrate and electrically connected to the touch-sensing structure;
   a first connecting pin assembly disposed on the substrate and located in a position different from the touch-sensing structure, the first connecting pin assembly having a plurality first connecting pins arranged along a first axis, and the first connecting pins being electrically connected to a portion of the signal transmitting layer; and
   a second connecting pin assembly disposed on the substrate and located in a position different from the touch-sensing structure, the second connecting pin assembly having a plurality second connecting pins arranged along a second axis, and the second connecting pins being electrically connected to another portion of the signal transmitting layer, the second axis of the second connecting pin assembly and the first axis of the first connecting pin assembly being not arranged in the same axis.

2. The touch-sensing device of claim 1, wherein the first axis of the first connecting pin assembly and the second axis of the second connecting pin assembly are parallel or perpendicular.

3. The touch-sensing device of claim 1, wherein the first connecting pin assembly is adjacent to the second connecting pin assembly, the first connecting pin assembly is oriented parallel to an arrangement direction, and the first connecting pin assembly is oriented perpendicular to the second connecting pin assembly.

4. The touch-sensing device of claim 1, further comprising:
   a third connecting pin assembly electrically connected to the touch-sensing structure, the second connecting pin assembly and the third connecting pin assembly paralleling the first connecting pin assembly, the third connecting pin assembly being spaced from the second connecting pin assembly, the first connecting pin assembly, the second connecting pin assembly and the third connecting pin assembly paralleling an arrangement direction.

5. The touch-sensing device of claim 1, further comprising:
a decorating plate disposed on at least one periphery of the substrate, wherein the substrate is a covering plate.

6. The touch-sensing device of claim 1, further comprising:
a covering plate paralleling the substrate; and
a decorating layer disposed on at least one periphery of the substrate.

7. The touch-sensing device of claim 6, wherein a transparent optical adhesive is disposed between the covering plate and the substrate for combining the covering plate and the substrate.

8. A touch-sensing display, comprising:
a touch-sensing device, comprising:
   a substrate;
   a touch-sensing structure disposed on the substrate;
   a signal transmitting layer disposed on the substrate and electrically connected to the touch-sensing structure;
   a first connecting pin assembly disposed on the substrate and located in a position different from the touch-sensing structure, the first connecting pin assembly having a plurality first connecting pins arranged along a first axis, and the first connecting pins being electrically connected to a portion of the signal transmitting layer; and
   a second connecting pin assembly disposed on the substrate and located in a position different from the touch-sensing structure, the second connecting pin assembly having a plurality second connecting pins arranged along a second axis, and the second connecting pins being electrically connected to another portion of the signal transmitting layer, the second axis of the second connecting pin assembly and the first axis of the first connecting pin assembly being not arranged in the same axis; and
a flexible printed circuit board having a first contact assembly and a second contact assembly respectively corresponding to the first connecting pin assembly and the second connecting pin assembly, wherein the first connecting pin assembly is electrically connected to the first contact assembly, and the second connecting pin assembly is electrically connected to the second contact assembly.

9. A touch-sensing display, comprising:
a touch-sensing device, comprising:
   a substrate;
   a touch-sensing structure disposed on the substrate;
   a signal transmitting layer disposed on the substrate and electrically connected to the touch-sensing structure;
   a first connecting pin assembly disposed on the substrate and located in a position different from the touch-sensing structure, the first connecting pin assembly having a plurality first connecting pins arranged along a first axis, and the first connecting pins being electrically connected to a portion of the signal transmitting layer; and
   a second connecting pin assembly disposed on the substrate and located in a position different from the touch-sensing structure, the second connecting pin assembly having a plurality second connecting pins arranged along a second axis, and the second connecting pins being electrically connected to another portion of the signal transmitting layer, the second axis of the second connecting pin assembly and the first axis of the first connecting pin assembly being not arranged in the same axis;
a flexible printed circuit board having a first contact assembly and a second contact assembly respectively corresponding to the first connecting pin assembly and the second connecting pin assembly, wherein the first connecting pin assembly is electrically connected to the first contact assembly, and the second connecting pin assembly is electrically connected to the second contact assembly; and
a display device disposed parallel to the touch-sensing device.

10. The touch-sensing display of claim 9, wherein a transparent optical adhesive is disposed between the touch-sensing device and the display device for combining the touch-sensing device and the display device.

* * * * *